United States Patent
Langer et al.

(10) Patent No.: US 6,716,650 B2
(45) Date of Patent: Apr. 6, 2004

(54) INTERFACE VOID MONITORING IN A DAMASCENE PROCESS

(75) Inventors: Eckhard Langer, Dresden (DE); Frank Koschinsky, Radebeul (DE); Volker Kahlert, Dresden (DE); Peter Hübler, Coswig (DE)

(73) Assignee: Advanced Micro Devices, Inc., Austin, TX (US)

( * ) Notice: Subject to any disclaimer, the term of this patent is extended or adjusted under 35 U.S.C. 154(b) by 6 days.

(21) Appl. No.: 10/121,122

(22) Filed: Apr. 11, 2002

(65) Prior Publication Data

US 2002/0168786 A1 Nov. 14, 2002

(30) Foreign Application Priority Data

May 8, 2001 (DE) .......................................... 101 22 136

(51) Int. Cl.[7] .............................................. H01L 21/66
(52) U.S. Cl. .............................. 438/14; 438/15; 438/16
(58) Field of Search ............................ 438/14–16, 629, 438/637, 687, 660, 758; 257/751, 520

(56) References Cited

U.S. PATENT DOCUMENTS

| | | | | |
|---|---|---|---|---|
| 5,761,064 A | | 6/1998 | La et al. ..................... 364/468 |
| 5,882,537 A | | 3/1999 | Ho et al. ....................... 216/59 |
| 5,930,587 A | * | 7/1999 | Ryan ............................ 438/14 |
| 6,057,171 A | * | 5/2000 | Chou et al. ................... 438/15 |
| 6,087,659 A | | 7/2000 | Adler et al. ................. 250/310 |
| 6,120,641 A | | 9/2000 | Stevens et al. .............. 156/345 |
| 6,133,132 A | | 10/2000 | Toprac et al. ............... 438/595 |
| 6,225,210 B1 | | 5/2001 | Ngo et al. ................... 438/624 |
| 6,297,155 B1 | * | 10/2001 | Simpson et al. ............ 438/687 |
| 6,303,399 B1 | * | 10/2001 | Engelmann et al. .......... 438/14 |
| 6,399,177 B1 | * | 6/2002 | Fonash et al. ............... 428/119 |
| 6,399,486 B1 | * | 6/2002 | Chen et al. .................. 438/660 |
| 6,417,093 B1 | * | 7/2002 | Xie et al. .................... 438/626 |
| 6,479,898 B1 | * | 11/2002 | Hopper et al. .............. 257/751 |
| 6,498,384 B1 | * | 12/2002 | Marathe ..................... 257/520 |
| 6,524,461 B2 | * | 2/2003 | Taylor et al. ............... 205/103 |
| 6,537,833 B1 | * | 3/2003 | Lensing ....................... 438/14 |
| 6,537,923 B1 | * | 3/2003 | Bhatt et al. ................. 438/758 |
| 6,541,286 B1 | * | 4/2003 | Bernard et al. .............. 438/14 |
| 6,559,033 B1 | * | 5/2003 | Hu et al. ..................... 438/444 |
| 2002/0072223 A1 | * | 6/2002 | Gilbert et al. .............. 438/629 |
| 2003/0022483 A1 | * | 1/2003 | Shroff et al. ............... 438/637 |

FOREIGN PATENT DOCUMENTS

JP 10318949 A 12/1998 ......... G01N/23/225

OTHER PUBLICATIONS

Skumanich et al., "Use of Test Structures for Cu Interconnect Process Development and Yield Enhancement," ICMTS, 63–66, 2000.
Shacham–Diamand, "Barrier Layers for Cu ULSI Meallization," *Journal of Electronic Materials*, 30:336–344, 2001.

* cited by examiner

*Primary Examiner*—John F. Niebling
*Assistant Examiner*—Olivia T. Luk
(74) *Attorney, Agent, or Firm*—Williams, Morgan & Amerson, P.C.

(57) ABSTRACT

For determining the quality of interconnections in integrated circuits, especially in damascene applications, a method of monitoring voids is disclosed, wherein a barrier metal layer is directly deposited on a planarized metal to provide a large-area surface that is not required to be destroyed for further analysis of the interface between the metal and the barrier metal layer. The analysis may be carried out by employing an electron microscope operated in a back-scatter mode.

22 Claims, 1 Drawing Sheet

INTERFACE VOID MONITORING IN A DAMASCENE PROCESS

BACKGROUND OF THE INVENTION

1. Field of the Invention

The present invention relates to the field of fabrication of integrated circuits, and, more particularly, to a method of monitoring voids in damascene and dual damascene structures.

2. Description of the Related Art

The need for high performance semiconductor chips has continued to increase over the past several years, while at the same time the functionality of the circuitry has become more complex and the amount of area per chip has decreased. One approach to increase the speed and performance of the semiconductor chip is to reduce the size of the individual integrated circuit components. In modem integrated circuits, the channel length, and thus the gate length, of a typical field effect transistor (FET) is scaled down to a size of 0.2 µm and less to reduce the switching speed of the FET elements sufficiently in order to allow, for example, a central processing unit (CPU) to operate with clock frequencies of up to 1 GHz and above. With small feature sizes, the performance of the semiconductor chips is not only limited by the switching speed of individual FET elements, but also by the electrical conductivity of the metal interconnects electrically connecting the various individual components and by the parasitic capacitances associated with the metal interconnects. In order to take full advantage of transistor elements capable of operating at fast speeds and exhibiting smaller feature sizes, the metal interconnects must be highly conductive and/or the parasitic capacitance between adjacent interconnect lines or vias should be kept as low as possible.

A typical process for surface wiring the individual components of an integrated circuit, also referred to as "metallization," is the so-called damascene process in which trenches and/or vias are formed in an insulating layer and are subsequently filled with a conductive material to form the conductive lines interconnecting the individual components of the integrated circuit. Currently, most of the silicon-based semiconductor chips comprise a metallization layer including silicon dioxide as a dielectric material and aluminum as the conductive material due to aluminum's excellent adhesion to the surrounding silicon dioxide without any tendency to diffuse into the silicon dioxide. For integrated circuits having critical feature sizes of 0.5 µm and less, the so-called interconnect delay caused by the limited conductivity of the metal lines and the relatively high dielectric constant of the silicon dioxide begins to dominate the switching speed of individual semiconductor elements. Thus, great efforts have been made to replace the metal and/or the dielectric by an appropriate material so as to reduce the RC constant defined by the resistance of the conductive lines and the parasitic capacitance between adjacent lines.

Among various materials, copper has been proven to be one promising candidate for replacing the aluminum, due to its lower specific resistance which is about one order of magnitude smaller than that of aluminum. Moreover, contrary to aluminum, copper does not show eutectic reactions and thermally-induced electromigration when used in very large scale integration ("VLSI") and ultra-large scale integration ("ULSI") semiconductor chips. Additionally, copper is capable of being deposited at low temperatures with high aspect ratios, thereby yielding a good step coverage.

As previously explained, in order to provide a highly reliable integrated circuit, the metal of the interconnect lines has to sufficiently adhere to the surrounding dielectric material, and diffusion of the metal atoms into the dielectric material must be reduced as much as possible. Thus, in many cases, the metal may not be directly deposited onto the dielectric material. Instead, a barrier layer is deposited on the surface of the dielectric layer prior to deposition of the metal. For example, copper readily diffuses into silicon dioxide and does not sufficiently adhere to silicon dioxide. Accordingly, a thin barrier layer is deposited to provide for sufficient adhesion of the copper and to prevent diffusion of the copper into the silicon dioxide.

Tantalum is an attractive barrier material because of its high melting point and immiscibility with copper. Furthermore, it provides a low-resistance ohmic contact and excellent adhesion to copper. Doping the tantalum with nitrogen blocks grain boundary diffusion paths. Therefore, tantalum nitride, for instance deposited by reactive sputtering of tantalum in the presence of nitrogen, can also be used as a barrier layer. Therefore, titanium nitride is also well-suited as a barrier material. These layers can be deposited by sputtering or CVD (chemical vapor deposition).

In the damascene process for forming a metallization layer comprising, for example, silicon dioxide and copper, the generation of voids at the interface of the dielectric and the conductive material, especially at the bottom of vias formed in the dielectric on top of a preceding metallization layer, is a particularly serious issue. Furthermore, it was confirmed by different investigations that interface voids are generated between the barrier metal, e.g., tantalum or tantalum nitride, and the underlying copper. Such interface voids can be a result of an insufficient heat dissipation during sputtering and can form when the copper thermally contracts upon cooling after deposition. Thus, the damascene process has to be continuously monitored to obtain a required level of reliability of the integrated circuit.

With reference to FIG. 1, a typical prior art damascene process and a method of monitoring via voids will briefly be discussed. Reference number 1 denotes a standard damascene structure. A substrate 2, such as a silicon substrate or any other substrate appropriate for semiconductor or integrated circuit technology, may include various layers defining semiconductor elements, such as field effect transistors (FETs) (not shown). The substrate 2 is at least partially covered with a dielectric material, such as silicon dioxide ($SiO_2$), as a first insulating layer 3. Openings 9 are formed in the insulating layer 3. The openings 9 are filled with a metal, such as copper, tungsten or aluminum. The openings 9 are separated from each other and may form individual metal islands and/or metal lines of a first metallization layer.

The metal lines and/or islands will commonly be referred to as metal regions 4. Over the first insulating layer 3 and the metal regions 4 a second insulating layer 5 is located that comprises vias 7 in registration to the metal regions 4. A barrier layer 6 comprising, for example, tantalum or tantalum nitride, is deposited on the second insulating layer 5 and defines an interface 8 between the barrier layer 6 and the metal regions 4.

A typical process flow for manufacturing the damascene structure 1 of FIG. 1 may include depositing the first insulating layer 3 by any appropriate deposition process known in the art, forming the openings by lithography and etching, filling the openings 9 with a metal, such as copper, by, for example, electroplating, wherein prior to deposition of the copper a barrier layer (not shown) and a copper seed layer (not shown) may be deposited and the resulting structure is planarized by chemical mechanical polishing (CMP). Thereafter, the second insulating layer 5, for example, silicon dioxide (SiO$_2$), is deposited and patterned to form the vias 7. Next, the barrier layer 6 is sputter deposited onto the second insulating surface 5, wherein, as previously explained, voids (not shown) can be formed, especially at the interface 8, i.e., between the underlying metal region 4 and the barrier layer 6, caused by thermal stress due to heat created by the deposition of the barrier layer 6 and the subsequent cooling of the copper/barrier stack.

In general, interface voids are tiny compared to the via bottom area and are therefore difficult to be detected by electrical tests. In order to monitor process quality of the barrier layer deposition, a wafer bearing the damascene structure 1 is cut into pieces to prepare a sample for cross-section analysis by means of a transmission electron microscope, wherein the sample includes the interface 8 between the barrier layer 6 and the metal region 4.

To this end, a single piece containing the damascene structure 1 is to be thinned, for instance by focused ion beam (FIB) preparation, to obtain the required thickness for cross-section analysis, which is suitable for transmission electron microscopy (TEM) investigations. The preparation of samples for cross-section analysis is, however, very costly and time-consuming. Preparing the sample may take up to several hours and is usually carried out outside of the actual production area. Thus, the sputter or the CVD machine under consideration has to be maintained on hold until the test results are obtained, thereby significantly reducing throughput of the machine, or may be released on risk, thereby possibly decreasing production yield. Furthermore, in general, it is very difficult to prepare a plurality of suitable samples from the same test wafer, so that it is extremely complicated and costly to monitor via voids across the entire wafer area. Moreover, cross-section analysis necessitates the destruction of the samples and therefore prevents further use of these samples.

Therefore, it is desirable to develop a method for monitoring voids in damascene applications that simplifies the monitoring procedure, favorably without sample destruction, at a high degree of reliability.

SUMMARY OF THE INVENTION

According to one aspect of the present invention, a method comprises providing a substrate having a surface with a dielectric layer located over the surface, wherein the dielectric layer has openings formed therein. Moreover, the method includes depositing a metal at least in the openings and planarizing a surface of the metal in the openings. Additionally, the method includes depositing a barrier metal layer over the planarized surface of the metal and determining characteristics of an interface formed by the planarized surface of the metal and the barrier metal layer to monitor void generation at the interface.

BRIEF DESCRIPTION OF THE DRAWINGS

The invention may be understood by reference to the following description taken in conjunction with the accompanying drawings, in which like reference numerals identify like elements, and in which.

Figure 1:
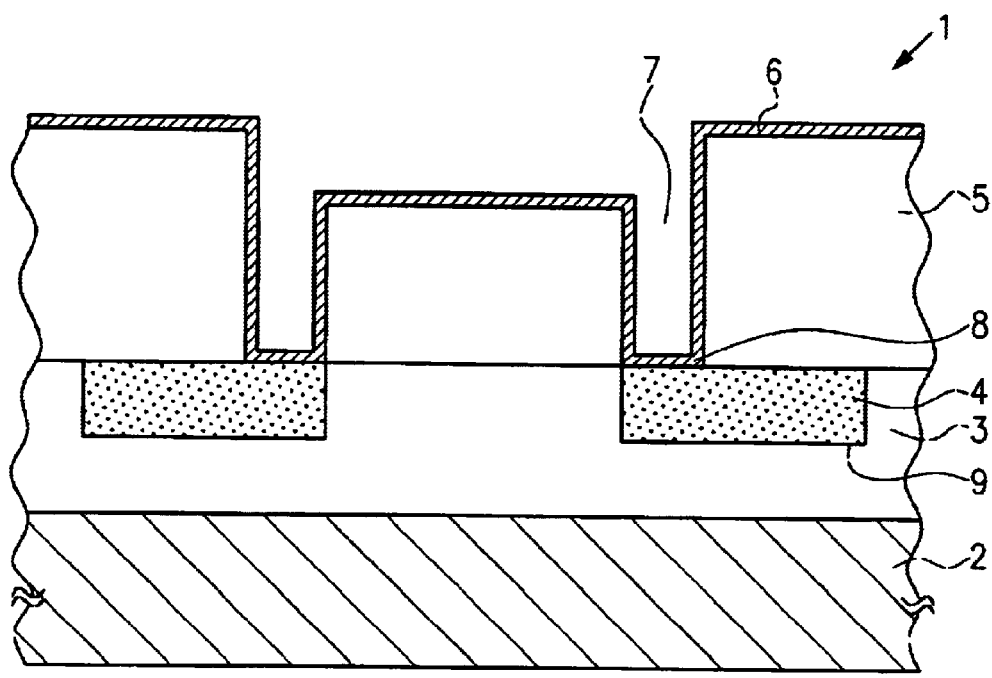
FIG. 1 schematically shows an illustrative process flow for damascene applications.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Moreover, various process steps as described below may be performed differently depending on particular design requirements. Furthermore, in this description only the relevant steps of the manufacture and the portions of the device necessary for understanding of the present invention are considered.

According to the present invention, an efficient and fast method of preparing test substrates is provided that may be used to determine the characteristics of the interface between a barrier metal layer and an underlying metallization structure. Although the barrier metal layer may comprise a non-metal, such as tantalum nitride, titanium nitride, and the like, the term "barrier metal layer" will be used throughout this application in conformity with the usual semiconductor terminology. The term barrier metal layer, thus, includes any appropriate material, such as tantalum and/or tantalum nitride and/or titanium and/or titanium nitride. During the inventor's researches, it was confirmed that the interaction of the barrier layer deposition with the metal, such as copper, underlying the barrier layer is the most critical part and the main reason for the generation of voids at the interface. Accordingly, in the method of monitoring interface void generation according to the present invention, the barrier layer is directly deposited onto the metal, for example, copper, thereby circumventing additional steps like oxide deposition and trench or via etch, so as to achieve the shortest process monitor loop with the highest metal area sensitivity for interface void detection.

Thereafter, characteristics of the interface related to the presence of voids may be determined at a substantially planar large area surface of the barrier layer without the interference of any additional structure formed on the barrier layer, which, in conventional interface monitoring, necessitates complex cross-section analysis, including thinning and, thus, destruction of the samples. The determination of the characteristics of the interface with respect to the presence of voids may be performed with an electron microscope used in the back-scatter mode, wherein electrons can penetrate through the barrier layer into the interface between the barrier layer and the underlying metal and into the upper part of the metal. If voids have been formed in that interface during the deposition process under consideration, the penetrated electrons exhibit a different back-scattering behavior as compared to the back-scattering behavior in the absence of voids. This results, for example, in a different energy and angle distribution of the back-scattered electrons.

Generally, electron microscopes are standard equipment in the semiconductor industry, and, therefore, the method of the present invention may easily be implemented into a conventional manufacturing process. Furthermore, according to the present invention, a complex FIB sample preparation is no longer necessary and eliminates the necessity to take the samples outside the clean room. As a consequence, void monitoring can be relatively easily accomplished within a relatively short time period. Thus, the measurement findings can be obtained within several minutes as compared to several hours in using the conventional method. This allows a rapid and efficient readjustment of process parameters, if necessary, to reliably prevent void formation.

Figure 2:
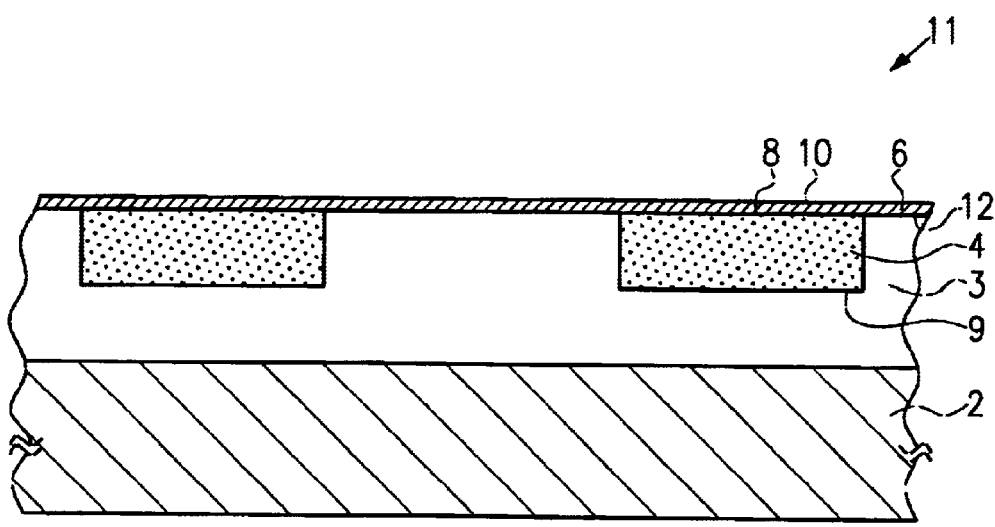
FIG. 2 schematically shows the process flow for monitoring voids in damascene applications in accordance with the present invention.

With reference to FIG. 2, an illustrative embodiment according to the present invention will be described. In FIG. 2, the same reference numerals as in FIG. 1 are used to denote similar or equal components and parts. FIG. 2 schematically shows a barrier-layer-monitor structure (BM structure) 11 according to one illustrative embodiment of the present invention. The BM structure 11 includes a substrate 2 that may include various layers with semiconductor elements used in semiconductor or integrated circuit technology. A dielectric material 3 covering, at least partially, the substrate 2 contains openings 9 filled with a metal 4. A barrier metal layer (not shown) may be formed in the openings 9 prior to the metal 4 being formed in the opening 9. The metal 4 forms islands and/or conducting lines embedded in the dielectric material 3. The metal 4 and the dielectric material 3 form an approximately planar surface 12. A barrier layer 6 comprised of a barrier metal, e.g., tantalum and/or tantalum nitride, is formed on top of the surface 12.

An illustrative process flow for manufacturing the BM structure 11 used for monitoring single and dual damascene processes may comprise the following steps. First, the dielectric material 3, such as silicon dioxide, is deposited by low pressure chemical vapor deposition (LPCVD), or any other appropriate deposition process, so that the adjustment of the thickness of the dielectric material 3 is precisely controllable. Subsequently, a photoresist layer (not shown) is deposited and patterned by well-known photolithography techniques to subsequently pattern the dielectric material 3 by means of known etch processes to create the openings 9 therein. Thereafter, the metal 4 is deposited on the dielectric material 3, thereby at least filling the openings 9 in the dielectric material 3. The metal 4 may be deposited by a CVD or by a physical vapor deposition (PVD) process, possibly including the deposition of a barrier layer and a seed layer (not shown). Although, in the present embodiment, copper is used as the metal 4, it is also possible to use, for example, tungsten or aluminum.

Next, the metal 4 is planarized, for instance by a CMP process. This process thins the metal 4 down to a plateau where the surface 12 of the dielectric material 3 and the planarized surface of the metal 4 are substantially on a common level. This process creates a smooth and planar surface, especially on the metal 4. It is also possible to planarize the surface only on individual metal islands. Subsequently, the barrier layer 6, for instance comprising tantalum and/or tantalum nitride, is deposited, for example, by a sputter deposition process, directly on the planarized metal 4 to achieve a thickness that is substantially predetermined by deposition parameters given by the process recipe for the actual product substrates. In this way, a planar, large-area barrier layer surface 10 can be generated that may be subject to further detailed investigations and determination of characteristics with respect to void generation at the interface 8.

In one illustrative embodiment, a beam of accelerated electrons generated by, for example, an electron microscope, is directed onto the surface 12 to penetrate the barrier layer 16, the surface 12 and the underlying interface 8. The electrons scattered back from the surface 12 and the interface 8 are then detected. To this end, the BM structure 11 may be analyzed using a scanning electron microscope to observe the intensity and the angular distribution of the back-scattered electrons.

Contrary to the damascene structure 1 of FIG. 1, the BM structure 11 does not contain any vias 7 and the second insulating layer 5. In general, the high aspect ratio of the vias 7 does not allow electrons to penetrate the interface 8 and to be readily detected after being scattered back in a number sufficient for confirmation of the presence and/or the absence of voids at the interface 8. According to the present invention, however, the back-scattered electrons do not experience any obstruction caused by side walls of the vias 7 and, thus, a signal received from the back-scattered electrons contains information about the structure of the barrier layer 6, the interface 8 and a part of the metal 4 from which characteristics can be determined regarding the presence of voids at the interface 8.

The acceleration voltage of the electron microscope is adjusted to particularly investigate the interface 8 between the planarized metal 4 and the barrier layer 6, where possible voids are preferably formed during the deposition of the barrier layer 6. The acceleration voltage may be varied in the range of about 8 to 20 keV. With this range of acceleration voltages, a penetration depth of the incident electrons can be controlled up to a depth of approximately 150 nm for a copper/tantalum layer stack. Accordingly, the entire region of interest, i.e., the interface 8, can be analyzed. For example, the acceleration voltage for an approximately 40 nm tantalum layer may be selected to about 10 keV, wherein a large fraction of the incident electrons also penetrates the copper 4 at least up to approximately 60 nm.

According to one illustrative embodiment, to obtain quantitative results and to facilitate adjustment of the electron microscope parameters, a simulation calculation may be carried out that represents the electromagnetic interaction of the electrons with the matter forming the layer stack, i.e., the barrier layer 6 and the metal 4. Corresponding algorithms for simulating electromagnetic events are well-known in the art and allow a rapid adjustment of the test parameters with respect to geometry, type of material, temperature, electron energy, angle of incidence, type of detector used in the electron microscope, and the like. Moreover, for a given parameter set of the electron microscope that is obtained by simulation and/or by experiment, the signals obtained from the BM structure 11 may be compared with simulation results to obtain quantitative information with respect to void diameter and/or location of voids and/or number of voids. Respective simulations may be performed in advance for a plurality of actual process parameters and may be stored in a library to allow a rapid screening of a plurality of test areas for different process conditions. Contrary to the conventional cross-section analysis, wherein the monitoring activity is limited to a few samples, the present invention allows information to be gathered at a plurality of locations on the BM structure 11 and/or from a plurality of different test substrates due to the quick and non-destructive sample preparation. Moreover, the substrates may be reworked and used for a further processing.

In a further illustrative embodiment, the measurement results obtained by electron microscopy in the back-scatter mode may be compared to cross-section analysis results of samples that have been prepared for cross-section analysis after having been subjected to interface void monitoring employing the back-scatter mode. The cross-section analysis delivers photographs including the interface 8 that may exhibit one or more voids. The appearance of these voids can be compared with the electrical signals obtained by the back-scatter analysis, wherein the signals can be assigned to a special void characteristic. Thereafter the time-consuming preparations of cross-sectional samples are no longer necessary. In this way, the signals obtained in the back-scattering mode may be calibrated in conformity with the cross-section analysis results. Corresponding calibration operations may be repeated on a regular basis to obtain a long-term stability of the void monitoring process.

In a further embodiment, alternatively or additionally, the cross-section analysis results may be compared to results of simulation calculations to verify the validity of the simulation results, which may then be used as reliable reference data for the back-scatter analysis without further reference to cross-section analysis. As in the previously described embodiment, this comparison may be carried out on a regular basis.

In a further illustrative embodiment, one or more specified test areas may be defined on the BM structure 11 for determining characteristics of the interface 8. These test areas may be formed, on the one hand, large enough for providing a suitable planar surface for electron microscopy analysis in the back-scatter mode, but, on the other hand, may only occupy a small fraction of the entire substrate area. For example, a single chip area could be prepared as such a test area. Providing such test areas eliminates the necessity of preparing separate test wafers for void monitoring. The one or more test areas may be provided at specified locations on correspondingly designed product wafers. Void monitoring in such test areas does not affect the remaining wafer areas and, thus, allows the wafer used for measurement to be further processed.

Although illustrative embodiments of the present invention have been described with reference to electron microscopy in back-scatter mode, other methods taking advantage of the large-area surface 12 for determining characteristics of the interface 8 with respect to void generation may be employed. For example, in one embodiment, respective portions at the surface 12 and at the metal 4 may be brought into contact with an external test unit, comprising, for example, a current source, a frequency generator, a voltage supply and the like, to determine electrical characteristics of the interface, such as resistance, capacitance, and the like, which may be sensitive to void generation in the interface 8. Due to the large-area surface 12 established by the method according to the present invention, the provision of electrical contacts to external measurement devices is significantly facilitated and the effect of the voids in the interface may be determined more precisely compared to standard electrical tests carried out with substrates manufactured according to the conventional procedure. Hence, the sensitivity for electrical tests that is provided by the method of the invention may be sufficient to allow void detection at the interface 8.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate having a surface with a dielectric layer located over the surface, the dielectric layer having openings formed therein;
   depositing a metal at least in the openings;
   planarizing a surface of the metal in said openings;
   depositing a barrier metal layer over the planarized surface of said metal; and
   determining characteristics of an interface formed by the planarized surface of said metal and the barrier metal layer to monitor void generation at the interface.

2. The method of claim 1, wherein determining characteristics of the interface comprises directing a beam of accelerated electrons toward the barrier metal layer and detecting electrons that are back-scattered from the substrate.

3. The method of claim 2, wherein determining characteristics of the interface comprises using an electron microscope.

4. The method of claim 3, wherein an acceleration voltage of the electron microscope is in the range of about 8 to 20 keV.

5. The method of claim 3, wherein an acceleration voltage of the electron microscope is about 10 keV.

6. The method of claim 1, wherein the metal is copper.

7. The method of claim 1, wherein planarizing is realized by a chemical mechanical polishing process.

8. The method of claim 1, wherein said planarizing of a surface of a metal in said openings is performed on individual metal islands.

9. The method of claim 1, wherein depositing of the barrier metal layer is performed subsequently to planarizing the surface of the metal in said openings.

10. The method of claim 1, wherein the barrier metal layer is approximately planar.

11. The method of claim 1, wherein the barrier metal layer is at least one of tantalum, tantalum nitride, tantalum/tantalum nitride and titanium nitride.

12. The method of claim 1, wherein a scanning electron microscope is used for determining the characteristics of the interface.

13. The method of claim 2, wherein determining characteristics of the interface comprises comparing measurement results of electron microscopy with simulation calculation results based upon at least one of a thickness of the barrier metal layer, a type of material used for the barrier metal layer and an acceleration voltage of the electrons.

14. The method of claim 13, further comprising adjusting at least one parameter of the electron microscope using simulation calculation results.

15. The method of claim 1, further comprising preparing a sample for cross-section analysis from the substrate after determining the characteristics of the interface, performing a cross-section analysis by a transmitting electron microscope and comparing the result of the cross-section analysis to the characteristics of the interface to establish a correlation between the characteristics of the interface and the voids formed at the interface.

16. The method of claim 2, further comprising preparing a sample for cross-section analysis from the substrate after determining the characteristics of the interface, performing a cross-section analysis by a transmitting electron microscope and comparing the result of the cross-section analysis to results of simulation calculation for the accelerated electrons to establish a correlation between the characteristics of the interface and the voids formed at the interface.

17. The method of claim 2, wherein determining the characteristics of the interface comprises adjusting an acceleration voltage of the electron microscope depending on the barrier metal layer.

18. The method of claim 2, wherein an acceleration voltage is adjusted to allow the electrons to penetrate into the barrier metal layer and the metal, respectively, about up to a depth of approximately 150 nm.

19. The method of claim 1, wherein determining the characteristics of the interface is performed in specified test areas on the substrate.

20. The method of claim 1, further comprising determining the characteristics of the interface at a plurality of specified locations of the substrate to monitor process quality substantially across the entire substrate area.

21. The method of claim 20, wherein a beam of accelerated electrons is directed to the plurality of specified locations.

22. The method of claim 1, wherein determining of the characteristics is performed on a non-destroyed area of the substrate.

* * * * *